(12) United States Patent
Muramatsu et al.

(10) Patent No.: US 6,576,882 B2
(45) Date of Patent: Jun. 10, 2003

(54) IMAGE SENSOR

(75) Inventors: Yoshinori Muramatsu, Tokyo (JP); Susumu Kurosawa, Tokyo (JP); Hiroaki Ohkubo, Tokyo (JP); Tsuyoshi Nagata, Tokyo (JP); Yasutaka Nakashiba, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/173,874

(22) Filed: Jun. 19, 2002

(65) Prior Publication Data

US 2002/0153474 A1 Oct. 24, 2002

Related U.S. Application Data

(62) Division of application No. 09/879,615, filed on Jun. 12, 2001.

(30) Foreign Application Priority Data

Jun. 14, 2000 (JP) ........................................ 2000-178666
Sep. 5, 2000 (JP) ........................................ 2000-268824

(51) Int. Cl.[7] ................................................. H04N 3/14
(52) U.S. Cl. .................................... 250/208.1; 348/308
(58) Field of Search ........................... 250/208.1, 214.1; 348/294, 300, 301, 307, 308; 257/291, 292, 444

(56) References Cited

U.S. PATENT DOCUMENTS 6,410,899 B1 * 6/2002 Merrill et al. ............ 250/208.1

FOREIGN PATENT DOCUMENTS

| JP | 63-53968 | 3/1988 |
| JP | 5-175471 | 7/1993 |
| JP | 6-189199 | 7/1994 |
| JP | 11-298798 | 10/1999 |
| JP | 11-312799 | 11/1999 |

OTHER PUBLICATIONS

"Wide Intrascene Dynamic Range CMOS APS Using Dual Sampling" Orly Yadid–Pecht, et al. (IEEE Transactions on Electron Devices, vol. 44, No. 10, pp. 1721–1723 (Oct. 1997).

* cited by examiner

Primary Examiner—Kevin Pyo
(74) Attorney, Agent, or Firm—Scully, Scott, Murphy & Presser

(57) ABSTRACT

The image sensor of the present invention performs two exposures of differing exposure times, holds the signal charge that is generated in photodiode 1 in the first exposure period in pixel interior capacitance 4 that is provided inside pixels and integrates the signal charge that is generated in photodiode 1 in the second exposure period with the first signal charge inside the pixels and executes readout, whereby the white (overexposed) portions that occur in the first exposure period are compensated by information of the second exposure period, and black (underexposed) portions that occur in the second exposure period are compensated by information of the first exposure period, and an image is obtained having wide dynamic range with respect to the amount of light in which underexposure and overexposure are mitigated.

4 Claims, 6 Drawing Sheets

IMAGE SENSOR

CROSS REFERENCE TO RELATED APPLICATION

The present application is a divisional of copending application Ser. No. 09/879,615, filed Jun. 12, 2001.

BACKGROUND OF THE INVENTION

1. Field of the Invention

The present invention relates to an image sensor, and particularly to an MOS image sensor that extends the dynamic range with respect to the amount of incident light.

2. Description of the Related Art

In contrast to a CCD image sensor that requires a dedicated process, MOS image sensors, such as the sensor of the present invention, have received considerable attention in recent years because they can be fabricated by standard MOS processes and therefore enable the advantages of low power consumption by means of a low-voltage and single-power supply and because they allow incorporation of peripheral logic and macros on a single chip.

FIG. 1 shows an example of a prior-art method of extending the dynamic range with respect to the amount of light by O. Yadid-Pecht and E. Fossum as reported in "Wide Intrascene Dynamic Range CMOS APS Using Dual Sampling", (IEEE Transactions on Electron Devices", Vol. 44, No. 10, pp. 1721–1723 (October, 1997).

According to this prior-art example for extending the dynamic range with respect to amount of light, the signal charge of pixel 21 for row n and row (n−Δ), which have different exposure times, is read out separately to each of first horizontal transfer register 22 above and second horizontal transfer register 23 below, and these are integrated off-chip.

The above-described method, however, results in an increase in circuit scale because it necessitates both upper and lower horizontal scan circuits. There is the additional drawback that system scale increases because the integration of two screens having different exposure times is realized by off-chip processing.

SUMMARY OF THE INVENTION

It is an object of the present invention to provide an image sensor that can realize an image having wider dynamic range with respect to the amount of light in which overexposure and underexposure are mitigated without an accompanying increase in circuit scale.

The first image sensor of the present invention is an image sensor that includes a semiconductor device having a semiconductor region and a diffusion layer formed within the semiconductor region having the opposite conductivity of the semiconductor region; that, after discharging carrier in the diffusion layer of the semiconductor device, causes light to be irradiated into the diffusion layer to generate carrier in the diffusion layer, outputs a signal to an output section based on the surface potential of the generated carrier, and measures the amount of incident light; and that includes:

a timing generation means for creating: a first exposure period for, when irradiating light into the diffusion layer and generating carrier inside the diffusion layer, irradiating the light into the diffusion layer and generating a first carrier inside the diffusion layer; a storage period after the first exposure period for moving the first carrier to a storage section; a second exposure period after the storage period for irradiating the light into the diffusion layer and generating a second carrier inside the diffusion layer; and a readout period after the second exposure period; and a carrier integration means for, when outputting to an output section a signal based on the surface potential of carrier that is generated by the timing generation means and measuring the amount of incidence of light, integrating the first carrier and the second carrier in the readout period and reading out the integrated carrier.

Furthermore, in a first mode of application of the first image sensor; the operation of irradiating light into the diffusion layer during the first exposure period and generating the first carrier in the diffusion layer is carried out in a state in which the diffusion layer and storage section conduct, and the operation of moving the first carrier to the storage section during the storage period that follows the first exposure period is carried out in a state in which the diffusion layer and storage section are cut off. In addition, carrier in the first image sensor that is contained in the diffusion layer and storage section is discharged before the second exposure period by means of a reset transistor that is connected to the power supply.

In a second mode of application of the first image sensor of the present invention, the operation of irradiating light into the diffusion layer during the first exposure period and generating the first carrier in the diffusion layer is carried out in a state in which the diffusion layer and storage section are cut off, and the operation of moving the first carrier to the storage section during the storage period that follows the first exposure period is carried out in a state in which the diffusion layer and storage section conduct.

The second image sensor of the present invention is an image sensor that includes a semiconductor device having a semiconductor region and a diffusion layer formed inside the semiconductor region having the opposite conductivity of the semiconductor region; that, after discharging carrier in the diffusion layer of the semiconductor device, causes light to be irradiated into the diffusion layer to generate carrier in the diffusion layer, outputs a signal to an output section based on the surface potential of the generated carrier, and measures the amount of incident light; and that includes:

a timing generation means for creating: a first exposure period for, when irradiating light into the diffusion layer and generating a first carrier, irradiating the light into the diffusion layer and generating carrier in the diffusion layer; a storage period after the first exposure period for moving a portion of the first carrier to a storage section and leaving first carrier in the diffusion layer; a second exposure period after the storage period for irradiating light into the diffusion layer and generating the second carrier inside the diffusion layer, and a readout period after the second exposure period; and a carrier integration means for, when outputting to an output section a signal based on the surface potential of the generated carrier and measuring the amount of incidence of light, reading out carrier that is the sum of the second carrier and the first carrier that is left in the diffusion layer during a readout period.

In the above-described first and second image sensors of the present invention, a modification is possible in which carrier that is contained in the diffusion layer and storage section is discharged before the first exposure period by means of a reset transistor that is connected to the power supply; the period that extends-from the first exposure period to the second exposure period is positioned within the preceding readout period; and the first exposure period is longer than the second exposure period.

The third image sensor, which expands on the first image sensor of the present invention, is an image sensor that includes: a semiconductor device having a semiconductor region and a diffusion layer formed inside the semiconductor region having the opposite conductivity, of the semiconductor region; that, after discharging carrier in the diffusion layer of the semiconductor device, causes light to be irradiated into the diffusion layer to generate carrier in the diffusion layer, outputs a signal to an output section based on the surface potential of the generated carrier, and measures the amount of incidence of light; including:

a timing generation means for creating: when irradiating light into the diffusion layer and generating carrier inside the diffusion layer, a plurality of exposure periods that do not mutually overlap for irradiating light into the diffusion layer and generating carriers that correspond to the plurality of exposure periods inside the diffusion layer; a storage period for moving a preceding carrier that was generated inside the diffusion layer, in the one preceding exposure period of the plurality of exposure periods that relatively preceded to a storage section after the preceding exposure period; a succeeding exposure period after the storage period for irradiating the light into the diffusion layer after the preceding exposure period and generating a succeeding carrier inside the diffusion layer; and a readout period after the succeeding exposure period; and a carrier integration means for, when outputting to an output section a signal based on the surface potential of the generated carrier and measuring the amount of incidence of the light, integrating, in the readout period following the last exposure period of the plurality of exposure periods, the carrier that was stored in the storage section up to the exposure period immediately preceding the last exposure period and the carrier that was generated inside the diffusion layer in the last exposure period.

Next, the fourth image sensor, which expands on the second image sensor of the present invention, is an image sensor that includes a semiconductor device having a semiconductor region and a diffusion layer formed inside the semiconductor region having the opposite conductivity of the semiconductor region; that, after discharging carrier in the diffusion layer of the semiconductor device, causes light to be irradiated into the diffusion layer and carrier to be generated inside the diffusion layer, that outputs a signal that is based on the surface potential of the generated carrier to an output section and measures the amount of incident light; and that includes:

a timing generation means for creating: when irradiating light into the diffusion layer and generating carrier in the diffusion layer, a plurality of exposure periods that do not mutually overlap for irradiating light into the diffusion layer and generating carriers in the diffusion layer that correspond to the plurality of exposure periods; a storage period, which follows the relatively preceding exposure period of the plurality of exposure periods, for moving to a storage section a portion of preceding carrier that was stored in the diffusion layer in exposure periods up to the preceding exposure period; a succeeding exposure period for simultaneously leaving preceding carrier in the diffusion layer and, after the storage period, irradiating light into the diffusion layer after the preceding exposure period and generating a succeeding carrier in the diffusion layer; and a readout period after the succeeding exposure period; and a carrier integration means for, when outputting to an output section a signal based on the surface potential of generated carrier and measuring the amount of incidence of light, reading out carrier that is the sum of the preceding carrier that remained in the diffusion layer until the exposure period immediately preceding the last exposure period and the succeeding carrier that was generated in the diffusion layer in the last exposure period in the readout period following the last exposure period of the plurality of exposure periods.

In the above-described third and fourth image sensors of the present invention, a modification can be adopted in which the preceding exposure period of the plurality of exposure periods is a longer period than an exposure period that is positioned later; and in which a period that extends over a plurality of exposure periods is positioned within a preceding readout period.

A modification is adopted in common to each of the above-described first, second, third, and fourth image sensors of the present invention in which the diffusion layer constitutes the pixels of the image sensor and the storage section is provided inside pixels in correspondence to the diffusion layer.

The first, second, third, and fourth image sensors of the above-described present invention have the following circuit configuration:

The circuit configuration of the first, second, third, and fourth image sensors include unit pixels that are each composed of:

a photodiode of a structure that converts irradiated light to electrons, has its anode connected to ground, and extracts electrons from its cathode;

an amplification transistor having its gate connected to the cathode of the photodiode, its drain connected to a power supply line, and its source connected to the drain of a readout transistor;

a reset transistor having its source connected to the cathode of the photodiode, its gate connected to a reset line, and its drain connected to a power supply line, a pixel interior capacitance selection transistor having its drain connected to the cathode of the photodiode, its gate connected to the pixel interior capacitance selection line, and its source connected to pixel interior capacitance;

pixel interior capacitance having one end grounded and the other end connected to the source of the pixel interior capacitance selection transistor; and a readout transistor having its drain connected to the source of the amplification transistor, its gate connected to a horizontal selection line, and its source connected to a vertical readout line.

The pixel interior capacitance is composed of a MOS transistor and is of a construction in which the source and drain of the MOS transistor are short-circuited and connected to ground and the gate is connected to the source of the pixel interior capacitance selection transistor. The reset transistor and pixel capacitance selection transistor are both depletion-type MOS transistors, and in this case, the potential of the reset transistor when OFF is higher than the potential of the pixel capacitance selection transistor when OFF.

As described hereinabove, by performing two exposures of different exposure periods, mixing the signals that are generated in each exposure period in pixels (holding the signal charge that is generated in the first exposure period in capacitance that is provided in pixels and mixing the signal charge that is generated in the second exposure period with the first signal charge in the pixels), and reading out, the image sensors of the present invention can obtain an image of wider dynamic range with respect to the amount of light with mitigated overexposure and underexposure because overexposed portions in the first exposure period are compensated by information of the second exposure period and underexposed portions in the second exposure period are compensated by information of the first exposure period.

In addition, the invention has the advantage of enabling an extension of dynamic range without reducing the frame readout speed because the above-described two exposures can be performed during readout of one frame.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Before entering into an explanation of the embodiments of the present invention, the feature of the present invention will first be described.

The feature of the present invention resides in the execution of a plurality of light exposures of different durations during the readout of one frame in an MOS-type image sensor, the separate storage of the light charges that are stored in the memory regions that are provided in pixels in these different exposure periods, and during readout, the readout of these stored charges after mixing in the pixels.

Figure 1:
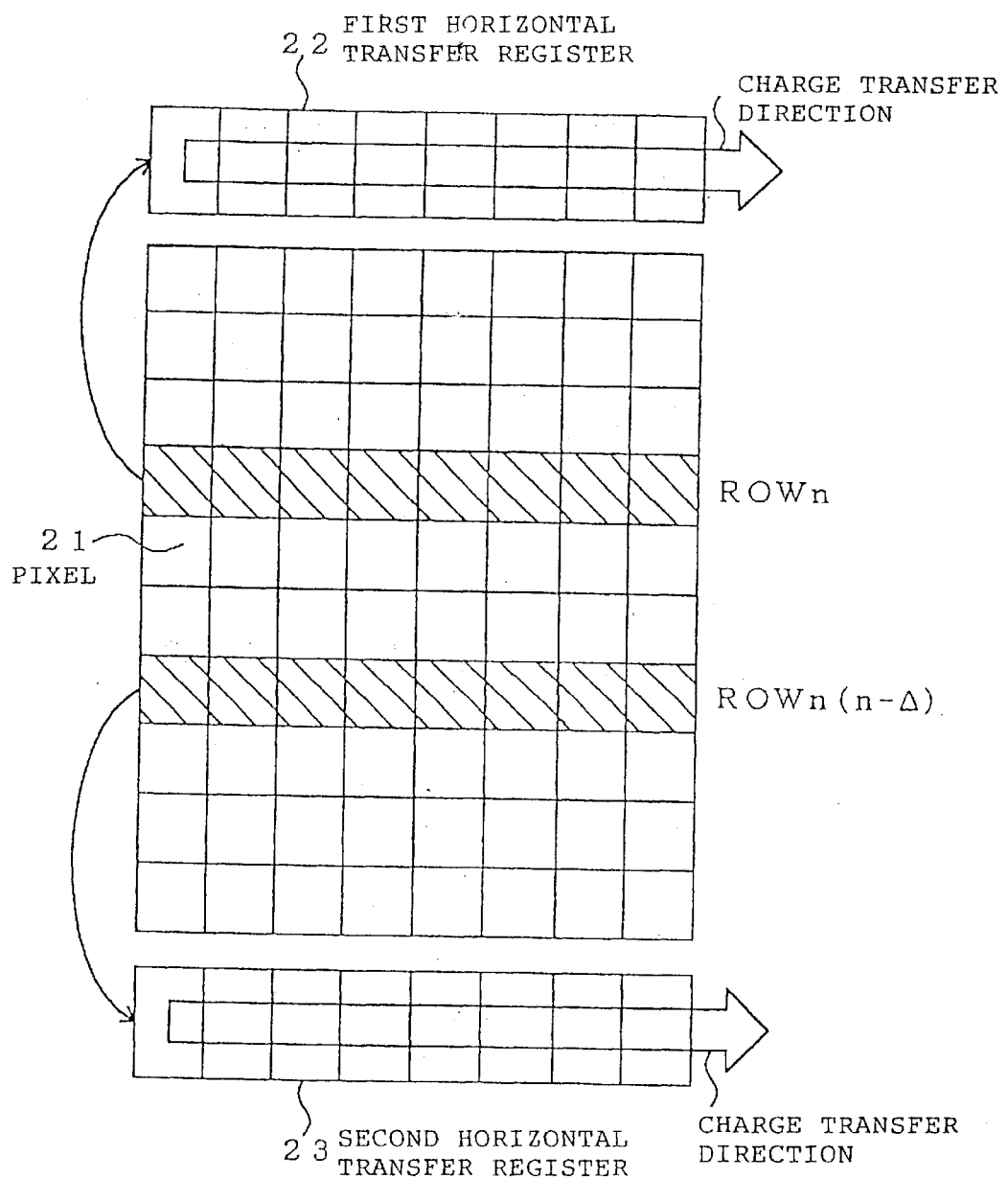
FIG. 1 is a schematic plan view of the vicinity of a pixel for explaining one method of extending the dynamic range of an image sensor of the prior art.
Figure 2:
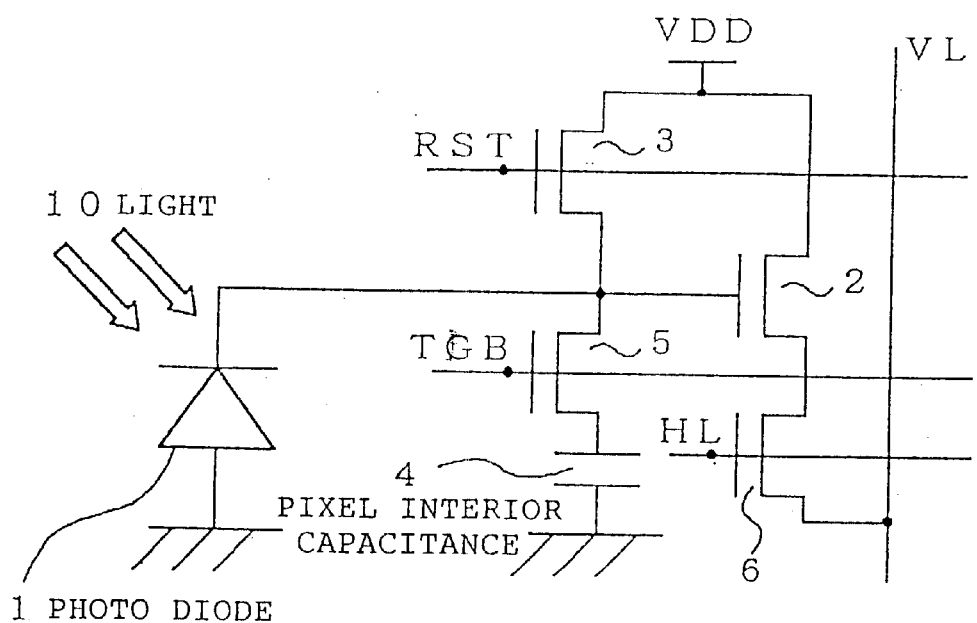
FIG. 2 is an equivalent circuit diagram for explaining an embodiment of the present invention.

According to the present invention, as shown by the circuit diagram of a pixel according to the present invention in FIG. 2, TGB (capacitance selection line) is held at high level and photodiode 1 and pixel interior capacitance 4 are caused to conduct, and RST (reset line) is activated to initialize photodiode 1, and the first exposure is started. In this first exposure period, the exposure time is set long to reduce the underexposure of the dark portions in the screen. The light charge is therefore saturated in bright portions within the screen, and overexposure occurs in some cases.

After the first exposure, TGB is set to a low level and the result of the first exposure is stored in pixel interior capacitance 4.

RST is then again activated to begin the second exposure. In this second exposure period, the exposure time is set shorter than in the first exposure period to reduce overexposure in the bright portions of the screen. After completing the second exposure, TGB is again set to high level, the result of the second exposure is mixed inside the pixels with the result of the first exposure result that is stored in pixel interior capacitance 4, and VL is activated for readout.

By means of this series of operations, regions in which overexposure occurred during the first exposure are compensated by the charges generated during the second exposure, and simultaneously, regions in which underexposure occurred during the second exposure are compensated by the stored charges of the first exposure, whereby overexposure and underexposure within a screen having a large contrast can be mitigated and the dynamic range with respect to light intensity can be extended.

Figure 3:
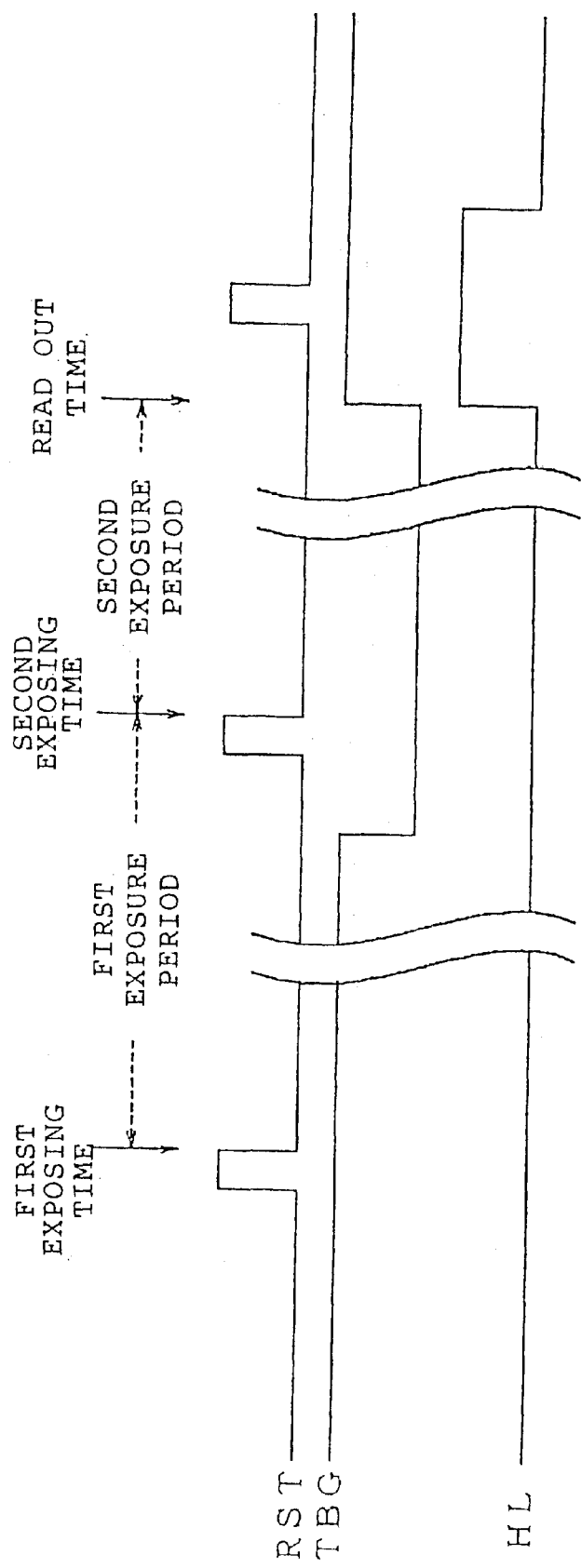
FIG. 3 is a timing chart showing the operation of the first embodiment of the present invention.

Referring now to FIGS. 2 and 3, the first embodiment of the present invention is next explained. FIG. 2 shows the circuit configuration of a pixel of a CMOS image sensor as the first embodiment of the present invention.

This CMOS image sensor includes: photodiode 1 that receives and converts light 10 to an electric signal and that has its anode side grounded; transistor 2 that operates as an amplifier having its gate connected to the cathode side that extracts electrons resulting from the photoelectric conversion from photodiode 1 and its drain connected to power supply line VDD; reset transistor 3 having its source connected to the cathode side of photodiode 1, its gate connected to reset line RST, and its drain connected to the power supply line VDD; transistor 5 having its drain connected to the cathode side of photodiode 1, its gate connected to pixel interior capacitance selection line TGB, and its source connected to pixel interior capacitance 4; pixel interior capacitance 4 having one end grounded; and readout transistor 6 having its drain connected to the source of transistor 2 that functions as an amplifier, its gate connected to horizontal selection line HL, and its source connected to vertical readout line VL. The operation of this embodiment is next explained.

The operation of the CMOS image sensor of the first embodiment of the present invention is next explained using the timing chart of FIG. 3.

Selection line TGB for selecting pixel interior capacitance 4 is first fixed to high level, and horizontal selection line HL is fixed to low level. In this state, a high-level pulse is applied to reset line RST, and the cathode of photodiode 1 and pixel interior capacitance 4 are reset to the power supply line level.

After the high-level pulse is applied to reset line RST, photodiode 1 enters the first exposure period, and electrons generated by the light signal accumulate on the cathode of photodiode 1. Upon completion of the first exposure period, selection line TGB of pixel interior capacitance 4 is set to low level and the signal of the first exposure period is stored in pixel interior capacitance 4.

Next, after continuously applying a high-level pulse to reset line RST and resetting the cathode of photodiode 1 to the level of power supply line VDD, photodiode 1 enters the second exposure period, and electrons generated by an optical signal are again accumulated on the cathode of photodiode 1.

After completion of the first and second exposure periods, selection line TGB of pixel interior capacitance 4 is set to high level and the signals of the first exposure period and the second exposure period are mixed to produce a mixed signal. Horizontal selection line HL is then set to high level and the mixed signal is read out to vertical readout line VL.

In this mixed signal, overexposed portions that occurred in the first exposure period are compensated by the information of the second exposure period, and underexposed portions that occurred in the second exposure period are compensated by the information of the first exposure period, whereby an image is obtained that has mitigated overexposure and underexposure, and moreover, that has wide dynamic range with respect to the amount of light.

The exposure time of the first exposure period is preferably set long to prevent underexposure of the dark portions of the imaged subject. Similarly, the exposure time of the second exposure period is preferably set shorter to prevent overexposure of the bright portions of the imaged section. This is because setting the exposure time longer in the first exposure period allows excess charge to be extracted to power supply line VDD by way of transistor 3 in cases in which the accumulated charge of photodiode 1 is saturated. Conversely, if a long exposure is performed in the second exposure time such that the accumulated charge of photodiode 1 may reach a saturated state, there is the danger that the excess charge will destroy the signal of the first exposure time that is stored in pixel interior capacitance 4.

Thus, by performing two exposures of different exposure times, mixing the signals that are generated in these exposure periods inside the pixels and than reading out the mixed signal, the overexposed portions that occur in the first exposure period are compensated by information of the second exposure period, and underexposed portions that occur in the second exposure period are compensated by the information of the first exposure period, and an image can be obtained having wide dynamic range with respect to the amount of light and in which the occurrence of overexposure and underexposure has been mitigated.

In addition, the above-described two exposures can be performed during the readout of one frame, and the present invention therefore has the advantage of allowing an expansion of the dynamic range without reducing the frame readout speed.

Although a case has been described in the above-described embodiment in which the transistors inside the pixel were of the n-channel type, exactly the same results can be obtained in the case of the p-channel type. In such a case, the polarity of the input signal and photodiode is obviously reversed.

A further extension of dynamic range can be achieved by increasing the pixel interior capacitance and pixel interior capacitance selection transistors to provide more than two exposure periods during the interval of one frame and then mixing inside the pixels by the same operation as in the foregoing explanation.

In addition, the layout area can be reduced by using transistors having both sources and drains grounded in pixel interior capacitance 4.

Further, the use of depletion-type transistors for both reset transistor 3 and pixel interior capacitance selection transistor 5 can prevent drops in the signal threshold value without boosting the high level of the transistor gate.

Still further, the use of depletion-type transistors such that the potential of reset transistor 3 when OFF is higher than the potential of pixel interior capacitance selection transistor when OFF enables control of blooming in which excessive charge is discharged to power supply line through reset transistor 3.

Figure 4:
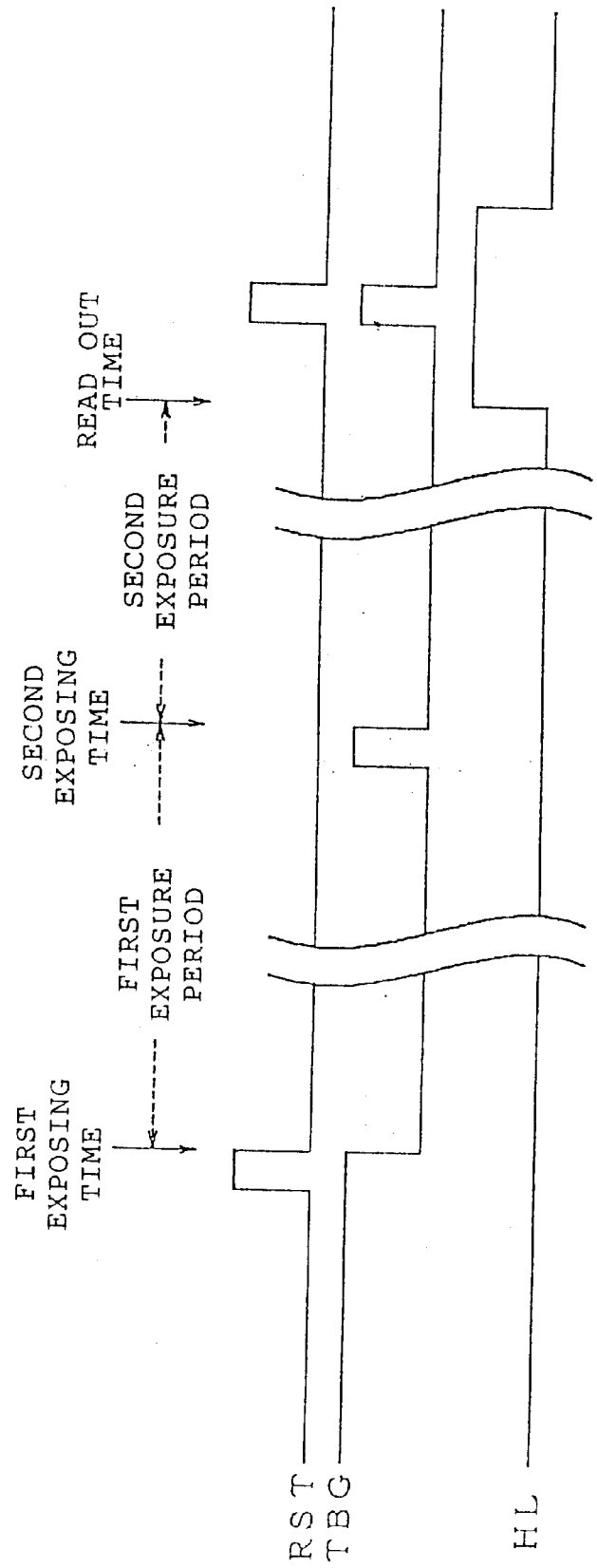
FIG. 4 is a timing chart showing the operation of the second embodiment of the present invention.

Although the configuration of the second embodiment of the present invention is basically the same as the first embodiment, the second embodiment is distinguished by differences in the method of operation from that of the first embodiment. The operation of the CMOS image sensor of the second embodiment of the present invention is next described using the timing chart of FIG. 4.

A high-level pulse is first applied to pixel interior capacitance 4 selection line TGB and reset line RST with horizontal selection line HL fixed to low level, whereby the cathode of photodiode 1 and pixel interior capacitance 4 are reset to the level of the power supply line. After applying the high-level pulse to pixel interior capacitance 4 selection line TGB and reset line RST, photodiode 1 enters the first exposure period, and electrons generated by an optical signal accumulate on the cathode of photodiode 1.

Upon the completion of the first exposure period, a high-level pulse is applied to pixel interior capacitance 4 selection line TGB and the signal of the first exposure period is stored in pixel interior capacitance 4. Photodiode 1 then enters the second exposure period and electrons generated by an optical signal continue to accumulate on the cathode of photodiode 1.

After the first and second exposure periods have been completed, horizontal selection line HL is set to high level and a signal is read out to vertical readout line VL. Since overexposed portions that occurred during the first exposure period are compensated in this signal, an image having wide dynamic range for the amount of light and mitigated overexposure is obtained.

Figure 5:
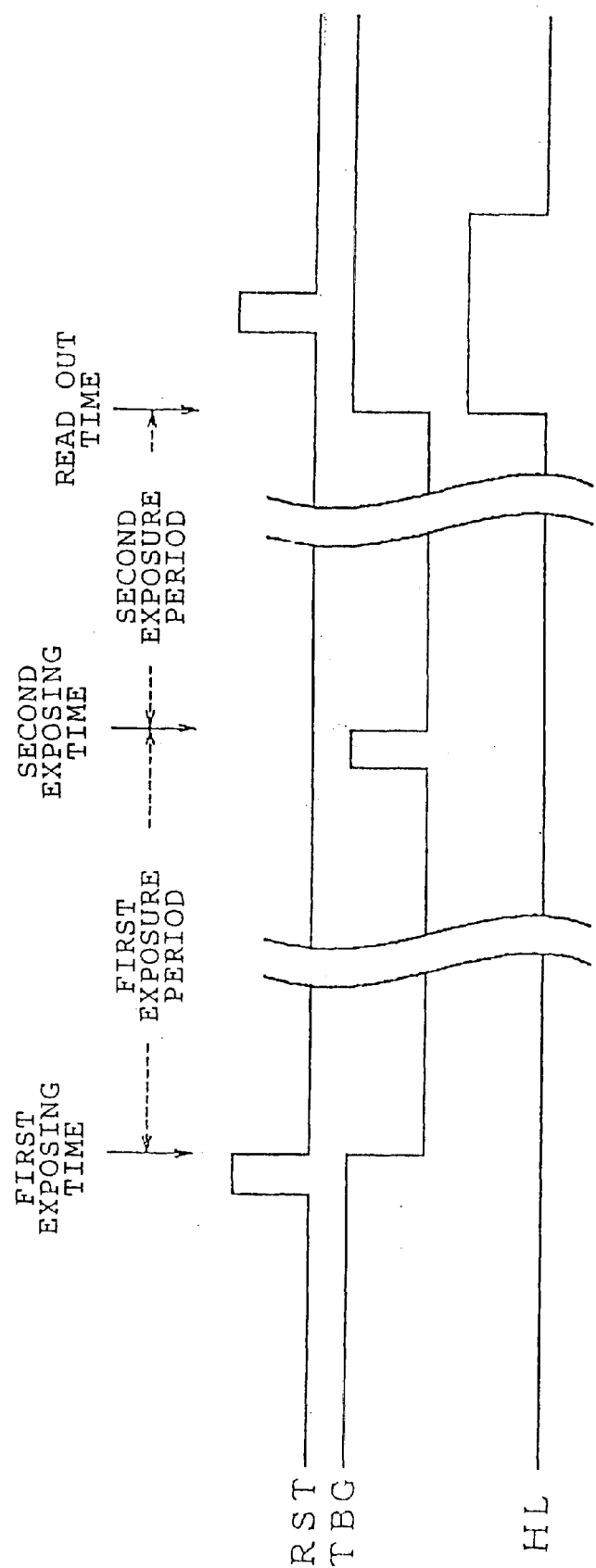
FIG. 5 is a timing chart showing the operation of the third embodiment of the present invention.

The operation of the CMOS image sensor of the third embodiment of the present invention is next explained using the timing chart of FIG. 5.

A high-level pulse is first applied to pixel interior capacitance 4 selection line TGB and reset line RST with horizontal selection line HL fixed to a low level, whereby the cathode of photodiode 1 and pixel interior capacitance 4 are reset to the power supply line level. After the high-level pulse has been applied to pixel interior capacitance 4 selection line TGB and reset line RST, photodiode 1 enters the first exposure period, and electrons that are generated by an optical signal accumulate on the cathode of photodiode 1.

When the first exposure period has been completed, a high level pulse is applied to pixel interior capacitance 4 selection line TGB and the signal of the first exposure period is stored in pixel interior capacitance 4. Photodiode 1 then enters the second exposure period, and electrons that are generated by an optical signal continue to accumulate on the cathode of photodiode 1.

After the first and second exposure periods have been completed, pixel interior capacitance 4 selection line TGB is set to high level, the signals of the first exposure period and the second exposure period are mixed, following which horizontal selection line HL is set to high level and the mixed signal is read out to vertical readout line VL. Because overexposed and underexposed portions that occurred during the first exposure period and second exposure period are mutually compensated in this mixed signal, an image having wide dynamic range with respect to the amount of light and having mitigated overexposure and underexposure can be obtained.

Figure 6:
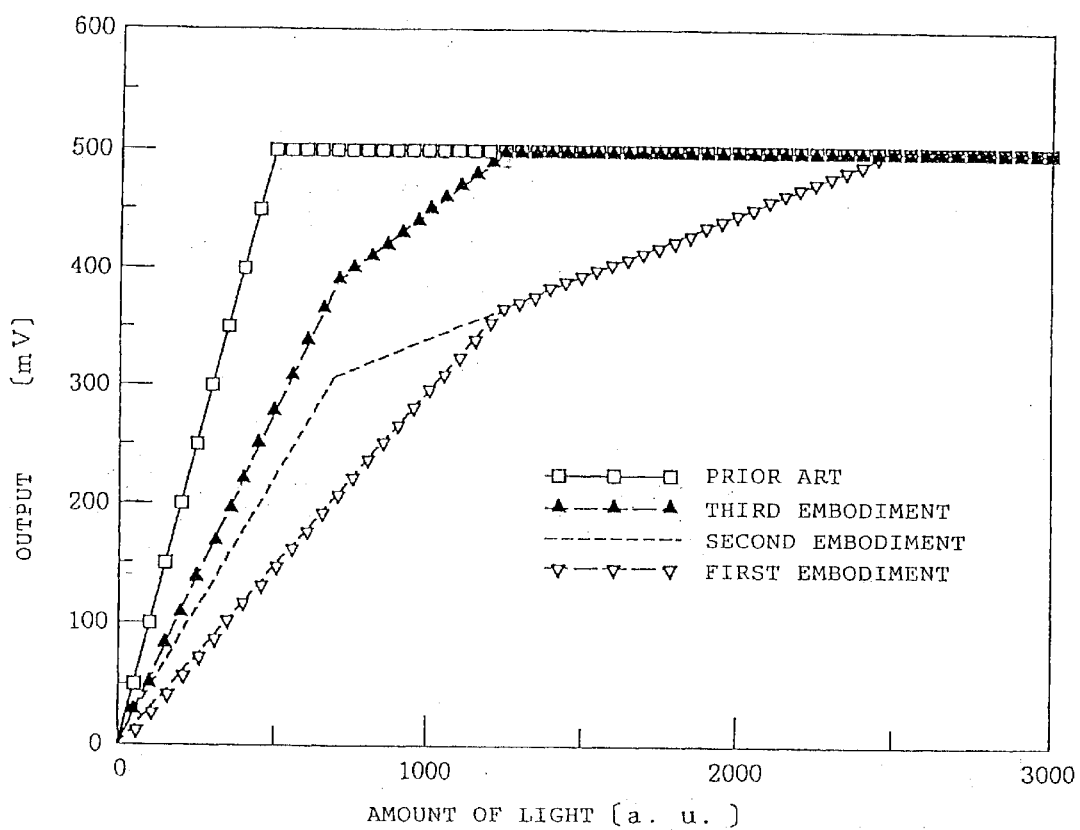
FIG. 6 is a graph showing the relation between the amount of light and output that is obtained by a method of the prior art, and the relation between the amount of light and the output obtained by the first, second and third embodiments of the present invention.

The effects of the first, second, and third embodiments are shown in FIG. 6. From these results, it can be seen that, compared to the prior art in which dynamic range is not extended, all embodiments tend to eliminate saturation of output with respect to the amount of light and the output varies over a wide range of amount of light, i.e., the dynamic range with respect to the amount of light has been extended.

While preferred embodiments of the present invention have been described using specific terms, such description is for illustrative purposes only, and it is to be understood that changes and variations may be made without departing from the spirit or scope of the following claims.

What is claimed is:

1. An image sensor having unit pixels comprising:

a photodiode of a structure that converts irradiated light to electrons, has an anode connected to ground, and extracts said electrons from a cathode;

an amplification transistor having gate connected to the cathode of said photodiode, drain connected to a power supply line, and source connected to the drain of a readout transistor;

a reset transistor having source connected to the cathode of said photodiode, gate connected to a reset line, and drain connected to said power supply line, a pixel interior capacitance selection transistor having drain connected to the cathode of said photodiode, gate connected to a pixel interior capacitance selection line, and source connected to pixel interior capacitance;

pixel interior capacitance having one end grounded and the other end connected to the source of said pixel interior capacitance selection transistor; and a readout transistor having drain connected to the source of said amplification transistor, gate connected to a horizontal selection line, and source connected to a vertical readout line.

2. An image sensor according to claim 1 having a construction wherein said pixel interior capacitance is constituted by an MOS transistor, the source and drain of said MOS transistor are short-circuited and grounded, and the gate is connected to the source of said pixel interior capacitance selection transistor.

3. An image sensor according to claim 1 wherein said reset transistor and said pixel interior capacitance selection transistor are both depletion-type MOS transistors.

4. An image sensor according to claim 3 wherein the potential of said reset transistor when OFF is higher than the potential of said pixel interior capacitance selection transistor when OFF.

* * * * *